United States Patent
Shroff et al.

(10) Patent No.: US 9,111,865 B2
(45) Date of Patent: Aug. 18, 2015

(54) METHOD OF MAKING A LOGIC TRANSISTOR AND A NON-VOLATILE MEMORY (NVM) CELL

(71) Applicants: Mehul D. Shroff, Austin, TX (US); Mark D. Hall, Austin, TX (US); Frank K. Baker, Jr., Austin, TX (US)

(72) Inventors: Mehul D. Shroff, Austin, TX (US); Mark D. Hall, Austin, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 240 days.

(21) Appl. No.: 13/661,157

(22) Filed: Oct. 26, 2012

(65) Prior Publication Data
US 2014/0120713 A1    May 1, 2014

(51) Int. Cl.
*H01L 21/8238* (2006.01)
*H01L 21/28* (2006.01)
*H01L 27/115* (2006.01)

(52) U.S. Cl.
CPC .... *H01L 21/28273* (2013.01); *H01L 21/28282* (2013.01); *H01L 27/11534* (2013.01); *H01L 27/11573* (2013.01)

(58) Field of Classification Search
CPC ................................. H01L 29/66825
USPC .......... 438/211, 183, 184, 257; 257/E21.422, 257/E21.645
See application file for complete search history.

(56) References Cited

U.S. PATENT DOCUMENTS

| | | |
|---|---|---|
| 5,614,746 A | 3/1997 | Hong et al. |
| 6,087,225 A | 7/2000 | Bronner et al. |
| 6,194,301 B1 | 2/2001 | Radens et al. |
| 6,235,574 B1 | 5/2001 | Tobben et al. |
| 6,333,223 B1 | 12/2001 | Moriwaki et al. |
| 6,388,294 B1 | 5/2002 | Radens et al. |
| 6,509,225 B2 | 1/2003 | Moriwaki et al. |
| 6,531,734 B1 | 3/2003 | Wu |
| 6,635,526 B1 | 10/2003 | Malik et al. |
| 6,707,079 B2 | 3/2004 | Satoh et al. |
| 6,777,761 B2 | 8/2004 | Clevenger et al. |
| 6,785,165 B2 | 8/2004 | Kawahara et al. |
| 6,939,767 B2 | 9/2005 | Hoefler et al. |
| 7,154,779 B2 | 12/2006 | Mokhlesi et al. |
| 7,183,159 B2 | 2/2007 | Rao et al. |

(Continued)

FOREIGN PATENT DOCUMENTS
WO    2009058486    5/2009

OTHER PUBLICATIONS

Office Action—Allowance mailed Feb. 21, 2014 in U.S. Appl. No. 13/441,426.
Office Action—Allowance mailed Feb. 28, 2014 in U.S. Appl. No. 13/442,142.
Office Action—Allowance mailed Mar. 3, 2014 in U.S. Appl. No. 13/790,014.

(Continued)

*Primary Examiner* — Julia Slutsker

(57) ABSTRACT

An oxide-containing layer is formed directly on a semiconductor layer in an NVM region, and a first partial layer of a first material is formed over the oxide-containing layer in the NVM region. A first high-k dielectric layer is formed directly on the semiconductor layer in a logic region. A first conductive layer is formed over the first dielectric layer in the logic region. A second partial layer of the first material is formed directly on the first partial layer in the NVM region and over the first conductive layer in the logic region. A logic device is formed in the logic region. An NVM cell is formed in the NVM region, wherein the first and second partial layer together are used to form one of a charge storage layer if the cell is a floating gate cell or a select gate if the cell is a split gate cell.

20 Claims, 7 Drawing Sheets

(56) References Cited

U.S. PATENT DOCUMENTS

| | | |
|---|---|---|
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,647,946 B2 | 2/2014 | Tan et al. |
| 8,679,927 B2 | 3/2014 | Ramkumar et al. |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111226 A1* | 4/2009 | Chindalore .................. 438/258 |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | Hall et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

Office Action mailed Jan. 31, 2014 in U.S. Appl. No. 13/781,727.

U.S. Appl. No. 13/928,666, Hong, Office Action—Rejection, mailed Jul. 23, 2014.

U.S. Appl. No. 14/041,662, Perera, Office Action—Restriction, mailed Aug. 1, 2014.

U.S. Appl. No. 13/969,180, Perera, Office Action—Allowance, mailed Aug. 5, 2014.

U.S. Appl. No. 13/781,727, Shroff, Office Action—Allowance, mailed Aug. 15, 2014.

U.S. Appl. No. 13/955,665, Office Action—Allowance, mailed Aug. 20, 2014.

U.S. Appl. No. 13/973,549, Hong, Office Action—Restriction, mailed Aug. 26, 2014.

U.S. Appl. No. 13/441,426, Shroff, Office Action—Allowance, mailed Sep. 26, 2014.

U.S. Appl. No. 14/041,662, Perera, Office Action—Allowance, mailed Oct. 17, 2014.

Office Action mailed Dec. 24, 2013 in U.S. Appl. No. 13/790,225.

Office Action mailed Dec. 24, 2013 in U.S. Appl. No. 13/790,014.

Office Action mailed Dec. 31, 2013 in U.S. Appl. No. 13/442,142.

Office Action mailed Jan. 16, 2014 in U.S. Appl. No. 13/491,771.

U.S. Appl. No. 13/781,727, Office Action—Allowance, May 12, 2014.

U.S. Appl. No. 13/441,426, Shroff, M. D., et al., Office Action—Allowance, mailed Jun. 9, 2014.

U.S. Appl. No. 13/907,491, Office Action—Rejection, Sep. 3, 2013.

U.S. Appl. No. 13/343,331, Office Action—Allowance, Nov. 8, 2013.

Chen, J.H., et al., "Nonvolatile Flash Memory Device Using Ge Nanocrystals Embedded in HfA1O High-k Tunneling and Control

(56) References Cited

OTHER PUBLICATIONS

Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1. 4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.
Mao, P., et al., "Nonvolatile memory devices with high density ruthenium nanocrystals", Applied Physics Letters, vol. 93, Issue 24, Electronic Transport and Semiconductors, 2006.
Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic ", Office Action—Allowance—May 15, 2013.
U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/781,727, Shroff, M., et al., "Methods of Making Logic Transistors and non-Volatile Memory Cells", Office Action—Rejection, Jun. 21, 2013.
U.S. Appl. No. 13/491,771, Hall, et al., Integrating Formation of a Replacement Gate Transistor and a Non-Volatile Memory Cell Using a High-K Dielectric, filed Jun. 8, 2012.
U.S. Appl. No. 13/343,331, Shroff, et al., "Non-Volatile Memory (NVM) and Logic Integration", filed Jan. 4, 2012.
U.S. Appl. No. 13/441,426, Shroff, et al., "Non-Volatile Memory (NVM) and Logic Integration", filed Apr. 6, 2012.
U.S. Appl. No. 13/491,760, Shroff, et al., "Integrating Formation of a Replacement Gate Transistor and a non-Volatile Memory Cell Using an Interlayer Dielectric", filed Jun. 8, 2012.
Office Action mailed Nov. 22, 2013 in U.S. Appl. No. 13/780,591.
Notice of Allowance mailed May 12, 2014 for U.S. Appl. No. 13/780,591 3 pages.
Notice of Allowance mailed Nov. 13, 2014 for U.S. Appl. No 13/780,591 7 pages.
Restriction Requirement mailed Feb. 9, 2015 for U.S. Appl. No. 14/041,647 5 pages.
U.S. Appl. No. 14/195,299, filed Mar. 3, 2014, entitled "Method of Making a Logic Transistor and Non-Volatile Memory (NVM) Cell".
U.S. Appl. No. 14/228,682, filed Mar. 28, 2014, entitled "Method for Forming a Split-Gate Device".
U.S. Appl. No. 14/041,647, filed Sep. 30, 2013, entitled "Non-Volatile Memory (NVM) and High-K and Metal Gate Integration Using Gate-First Methodology".
Non-Final Rejection mailed Apr. 30, 2015 for U.S. Appl. No. 14/195,299, 7 pages.
Notice of Allowance mailed Apr. 9, 2015 for U.S. Appl. No. 14/228,682, 9 pages.
Notice of Allowance mailed Jun. 10, 2015 for U.S. Appl. No. 14/041,647, 9 pages.

* cited by examiner

METHOD OF MAKING A LOGIC TRANSISTOR AND A NON-VOLATILE MEMORY (NVM) CELL

BACKGROUND

1. Field

This disclosure relates generally to semiconductor manufacturing, and more specifically, to the making of logic transistors and NVM cells.

2. Related Art

Non-volatile memories (NVMs) are often on an integrated circuit which also performs other functions. In such cases it is undesirable to sacrifice logic performance in favor of performance of the NVM. Also it is important to avoid or minimize additional cost in achieving high performance for both the logic and the NVM. Replacement gate, which is a technique for enhancing performance by using a dummy gate for the formation of source/drains and then replacing the dummy gate with a higher performance gate such as one with higher conductance and an optimized work function, has shown promise in improving performance. The replacement gate process is particularly helpful in allowing the use of both a metal gate and a high-k dielectric for the gate dielectric.

Accordingly there is a need to provide further improvement in achieving high performance while also addressing cost increase issues in integrated circuits that have both NVM and logic, particularly in the context of replacement gate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a logic transistor and an NVM cell are integrated on the same semiconductor substrate in which the logic transistor has a high-k gate dielectric and a metal gate, and the metal gate is achieved using a replacement gate approach. The NVM cell can either be a split gate type in which the select gate is made by two different depositions or a floating gate type in which a charge storage layer is made by two different depositions. In either case the two depositions are made at the same or substantially same point in the process relative to the logic transistor formation. This is better understood by reference to the FIGs. and the following description.

The semiconductor substrate described herein can be any semiconductor material or combination of materials, such as gallium arsenide, silicon germanium, silicon-on-insulator (SOI), silicon, monocrystalline silicon, the like, and combinations of the above.

Figure 1:
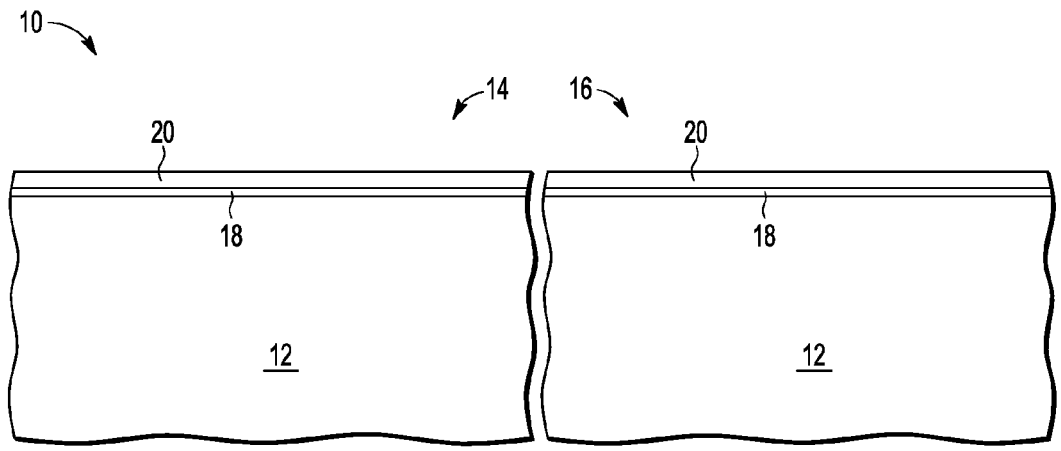
FIG. 1 is a cross section of a non-volatile memory cell and a replacement gate transistor at a stage in processing according to a first embodiment.

Shown in FIG. 1 is a semiconductor structure 10 comprising a semiconductor substrate 12 having an NVM region 14 and a logic region 16. On semiconductor substrate 12, which may be silicon, is formed a gate dielectric layer 18, which may be an oxide layer that may be grown at relatively high temperature, and a layer 20 that may be charge storage material or gate material. Layer 20 may be made of polysilicon, which can be used for either charge storage or for a gate such as a select gate. There are alternatives for the material choice for layer 20. One example is that layer 20 may be nitride which is effective as a charge storage layer. There are benefits of using high-k dielectrics but if those are not used, an oxide grown at high temperature, such as 900 degrees Celsius, is normally the highest quality insulator available in semiconductor manufacturing and is thus desirable for layer 18. The high temperature often makes it difficult or impossible to use in later portions of a semiconductor manufacturing process. An alternative that may be effective for layer 18 is silicon oxynitride which may be thermally grown or deposited. Another alternative that may be effective is for layer 18 to be a deposited oxide. Layer 18 can vary significantly in thickness, for example, 10 to 120 Angstroms. Layer 20 may be thicker than layer 18, for example, 200 to 500 Angstroms. The ranges in both cases could even be larger than these.

Figure 2:
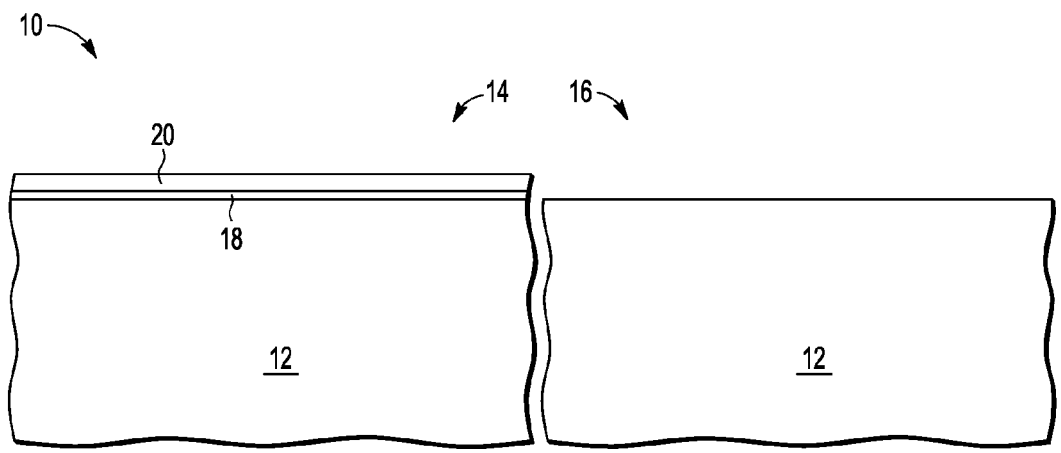
FIG. 2 is a cross section of a non-volatile memory cell and a replacement gate transistor of FIG. 1 at a subsequent stage in processing.

Shown in FIG. 2 is semiconductor structure 10 after removing layers 18 and 20 from the logic region 16. This can be formed by an etch while masking NVM region 14 with photoresist.

Figure 3:
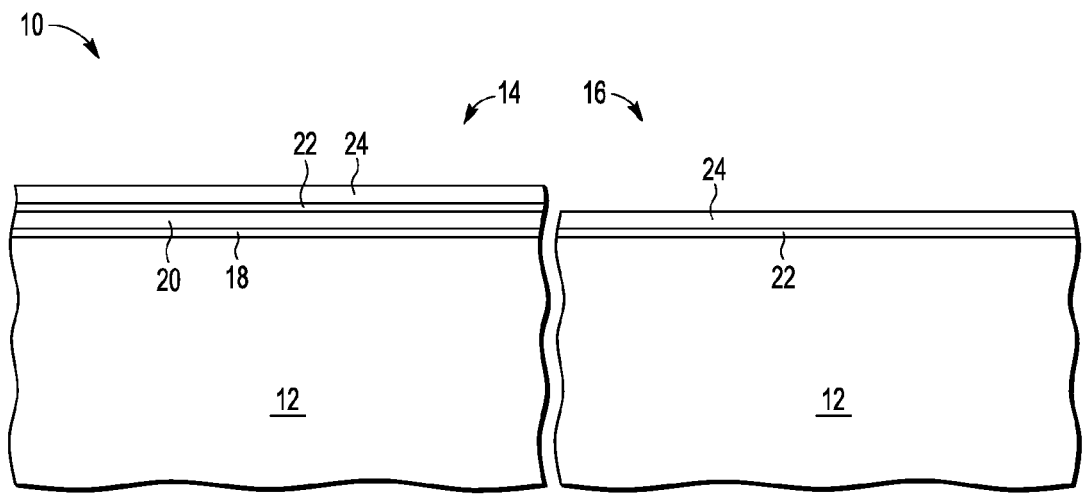
FIG. 3 is a cross section of a non-volatile memory cell and a replacement gate transistor of FIG. 2 at a subsequent stage in processing.

Shown in FIG. 3 is semiconductor structure 10 after depositing a high-k dielectric 22 and a barrier metal 24. High-k dielectric layer 22 may be hafnium oxide which may be about 10 to 50 Angstroms thick. Barrier metal 24 may be between 100 to 300 Angstroms. They may also be outside of these ranges. Barrier metal 24 may be tantalum nitride or other metals that can withstand the relatively high temperatures required for semiconductor processing before gate formation and that are useful for setting the work function of MOS transistors.

Figure 4:
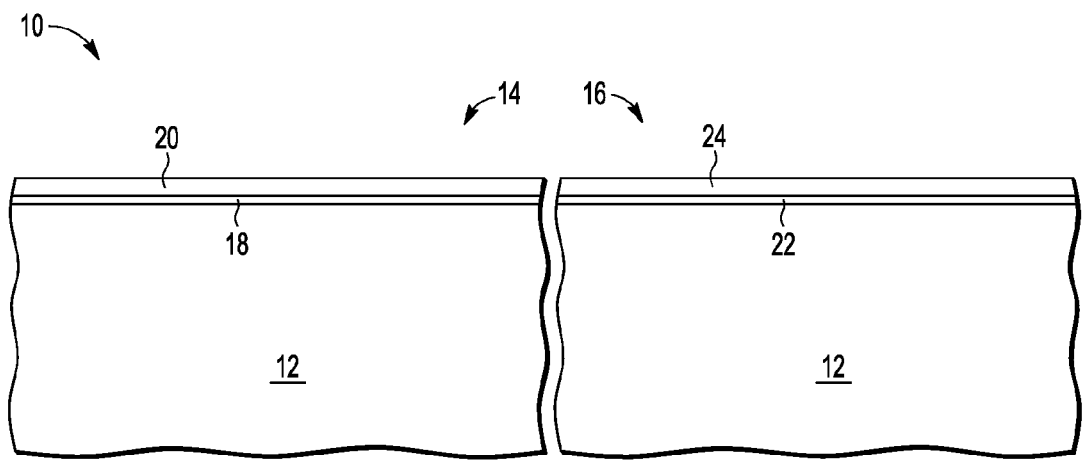
FIG. 4 is a cross section of a non-volatile memory cell and a replacement gate transistor of FIG. 3 at a subsequent stage in processing.

Shown in FIG. 4 is semiconductor structure 10 after high-k dielectric 22 and barrier metal 24 have been removed from NVM side 14, followed by a clean such as an HF-based clean to clean the surface of layer 20 which is especially beneficial in the NVM region. The removal can be achieved with an etch while masking logic region 16 with photoresist.

Figure 5:
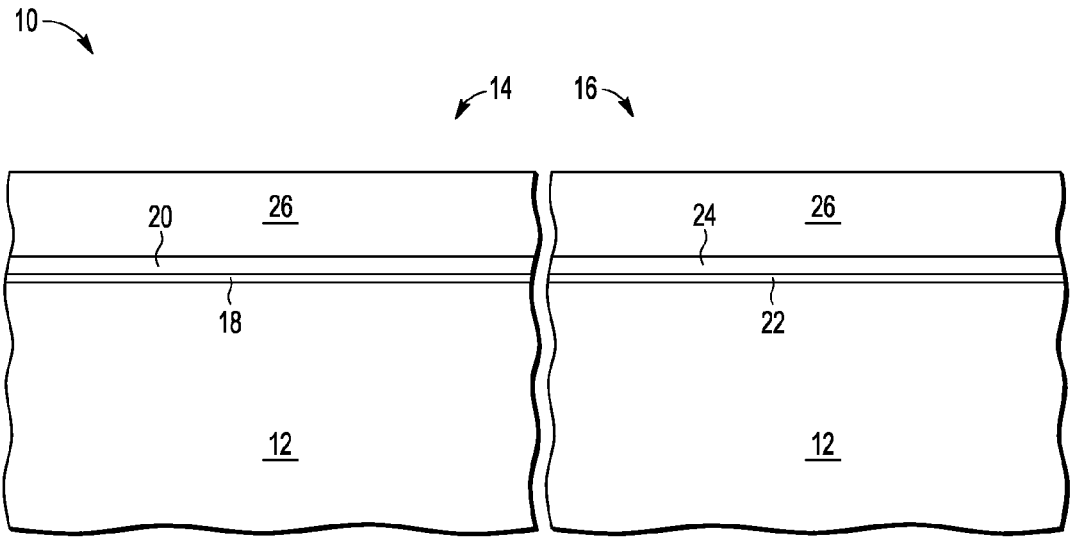
FIG. 5 is a cross section of a non-volatile memory cell and a replacement gate transistor of FIG. 4 at a subsequent stage in processing.

Shown in FIG. 5 is semiconductor structure 10 after depositing and planarizing a layer 26 on layer 20 in NVM region 14 and on layer 24 in logic region 16. Layer 26 is the same material as layer 20. For example, if layer 20 is polysilicon. then layer 26 is polysilicon, and if layer 20 is nitride, then layer 26 is nitride. Layer 26 may about 500 to 2000 Angstroms thick and may even be outside that range. Since layers 20 and 26 are the same material, the line between them may be difficult to discern.

Figure 6:
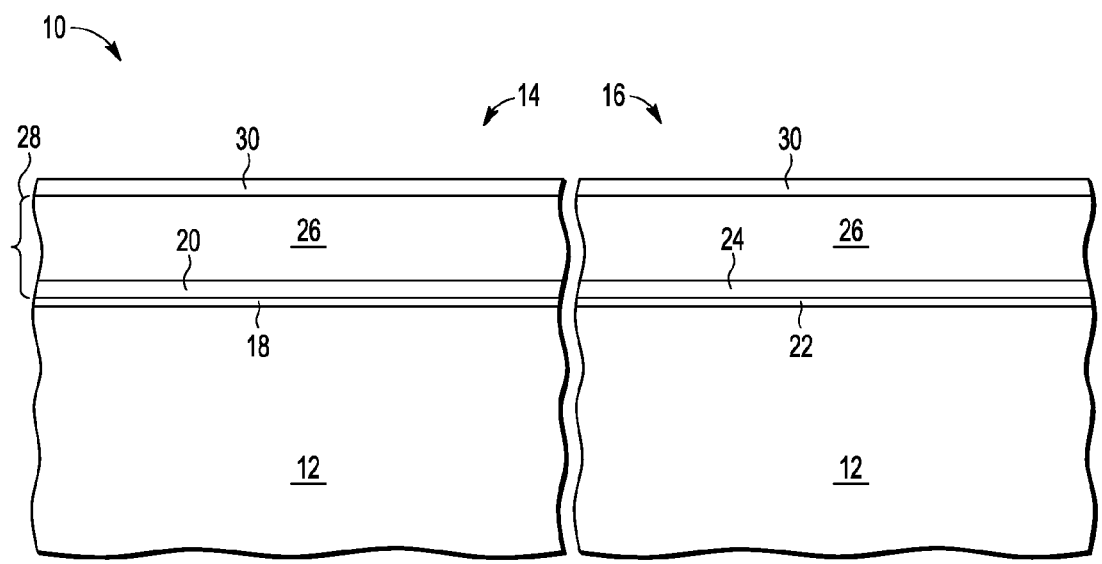
FIG. 6 is a cross section of a non-volatile memory cell and a replacement gate transistor of FIG. 5 at a subsequent stage in processing.

Shown in FIG. 6 is semiconductor structure 10 after forming a hard mask 30 on layer 26. Hard mask 30 may be nitride or another material that can provide selectivity for etch or chemical mechanical polishing (CMP) to layer 26. This also shows that layers 20 and 26 form single layer 28, since they are of the same material.

Figure 7:
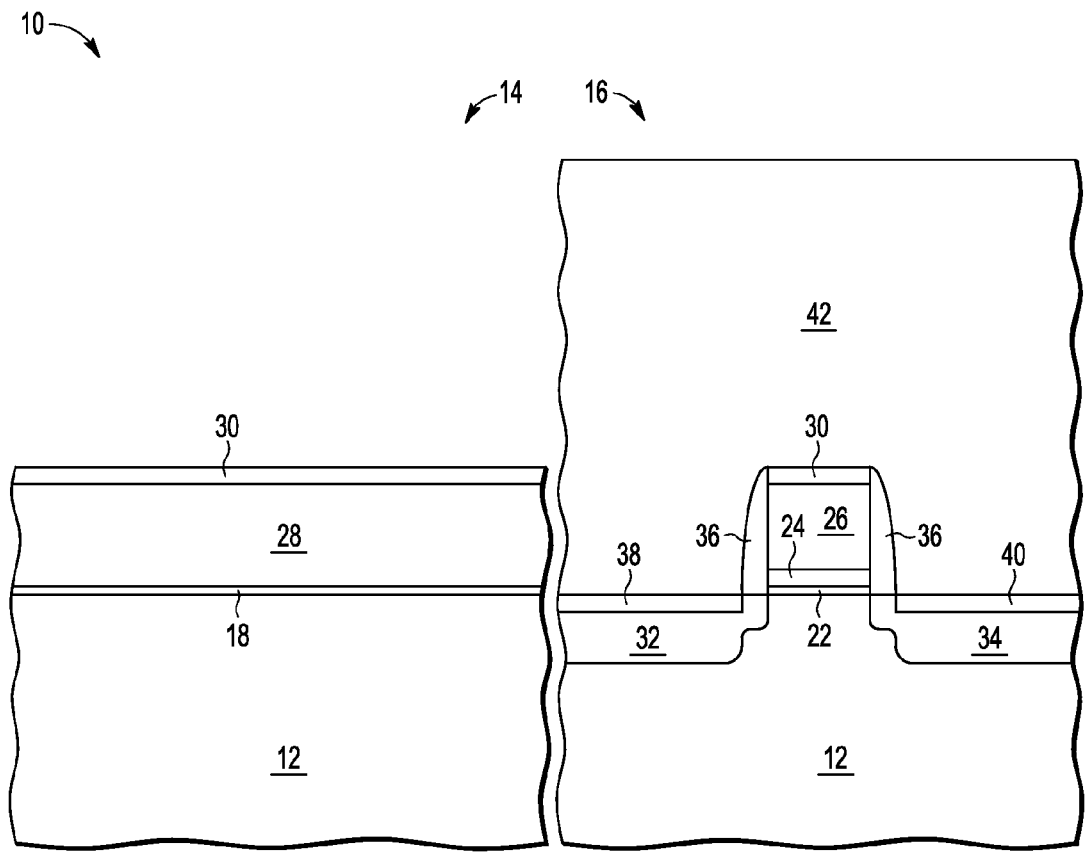
FIG. 7 is a cross section of a non-volatile memory cell and a replacement gate transistor of FIG. 6 at a subsequent stage in processing.

Shown in FIG. 7 is semiconductor structure 10 after processing logic region 16 to form a structure having transistor features in preparation for performing a replacement gate process and then covering logic region 16 with a photoresist layer 42. The result in logic region 16 is the formation of a replaceable gate formed of layer 26 and hard mask layer 30. Included is a sidewall spacer 36 around the replaceable gate formed of the remaining portions of layers 26 and 30. Source/drain regions 32 and 34 are formed in substrate 12 using the replacement gate and sidewall spacers as implant masks. On source/drain regions 32 and 34 are silicide regions 38 and 40, respectively. Also especially after the processing described for FIGS. 6 and 7, the line between layers 20 and 26 is very unlikely to be visible and is thus shown as a single layer 28.

Figure 8:
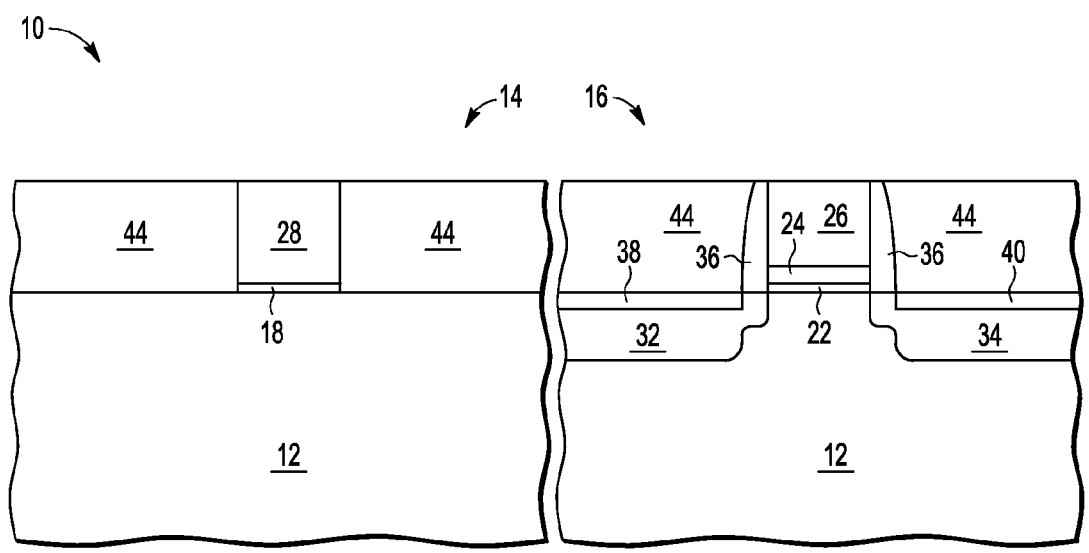
FIG. 8 is a cross section of a non-volatile memory cell and a replacement gate transistor of FIG. 7 at a subsequent stage in processing.

Shown in FIG. 8 is semiconductor structure 10 after patterning layer 28 and layer 18 aligned to layer 28 to leave a structure from layer 28 over substrate 12 and forming an interlayer dielectric (ILD) 44 around the structure formed from layer 28. Photoresist layer 42 is removed and subsequent deposition and planarizing steps result in the structure of layer 28 and surrounding ILD 44.

Figure 9:
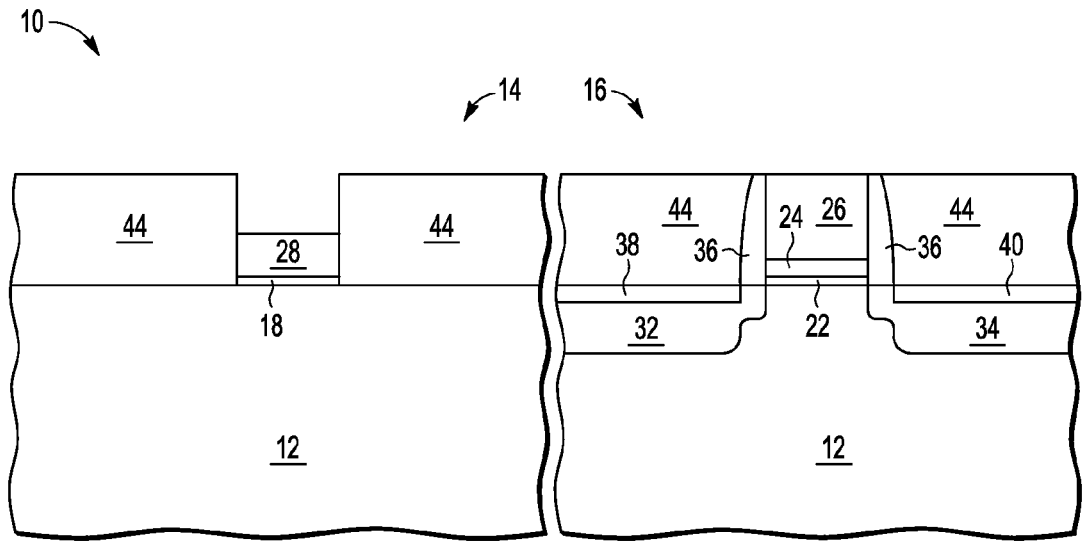
FIG. 9 is a cross section of a non-volatile memory cell and a replacement gate transistor of FIG. 8 at a subsequent stage in processing.

Shown in FIG. 9 is semiconductor structure 10 after an etch-back of the structure of layer 28 to about a third of its former height. Logic region 16 is masked during this etch.

Figure 10:
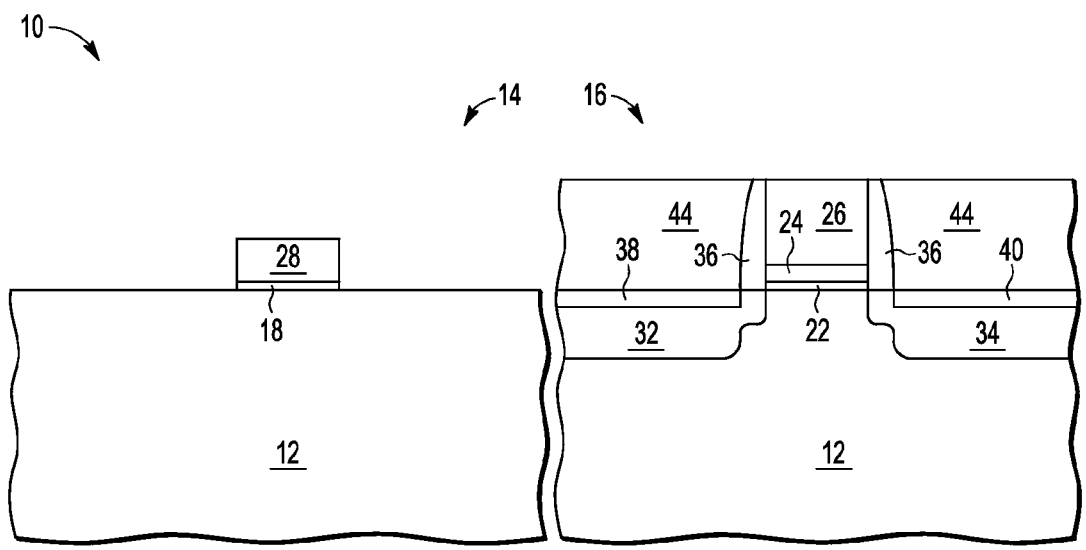
FIG. 10 is a cross section of a non-volatile memory cell and a replacement gate transistor of FIG. 9 at a subsequent stage in processing.

Shown in FIG. 10 is semiconductor structure 10 after removing ILD 44 from NVM region 14. This leaves a structure of layer 28 over layer 18 which is preferably high quality oxide formed using high temperature. Logic region 16 is masked during this removal.

Figure 11:
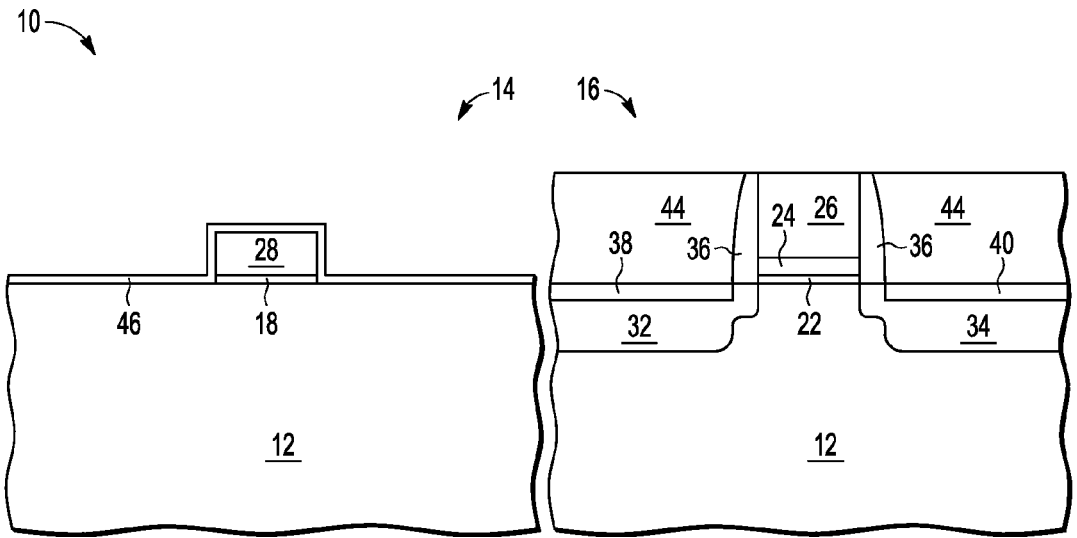
FIG. 11 is a cross section of a non-volatile memory cell and a replacement gate transistor of FIG. 10 at a subsequent stage in processing.

Shown in FIG. 11 is semiconductor structure 10 after forming a dielectric layer 46 which may be a composite of oxide, nitride, and oxide (ONO) and subsequently removing it from over logic region 16. Dielectric layer 46 is particularly beneficial as an insulator between a floating gate and a control gate.

Figure 12:
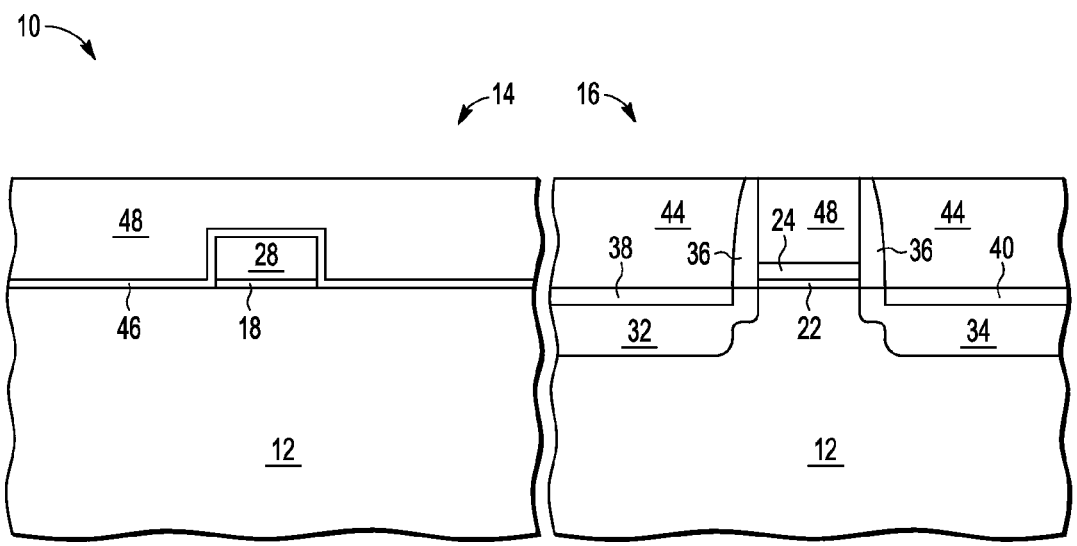
FIG. 12 is a cross section of a non-volatile memory cell and a replacement gate transistor of FIG. 11 at a subsequent stage in processing.

Shown in FIG. 12 is semiconductor structure 10 after forming a conductive layer 48 over dielectric layer 46 and replacing the replaceable gate formed of layer 26 with replacement gate 48 on barrier layer 24 by depositing a metal layer 48 over both logic region 16 and NVM region 14 and then performing CMP. Replacement of replaceable gate formed of layer 26 is performed by removing replaceable gate formed of layer 26 prior to deposition of metal layer 48. The result in logic region 16 is a metal gate logic transistor. In NVM region 14, an etch is performed on layer 48 to form word lines that run from left to right in FIG. 12. If needed, the option is available to deposit additional metal in NVM region 14 to lower sheet resistance of the word lines. The structure remaining from layer 28 may be a floating gate type of charge storage layer in the case of layer 28 being polysilicon or nitride trap-based charge storage layer in the case of layer 28 being nitride.

Figure 13:
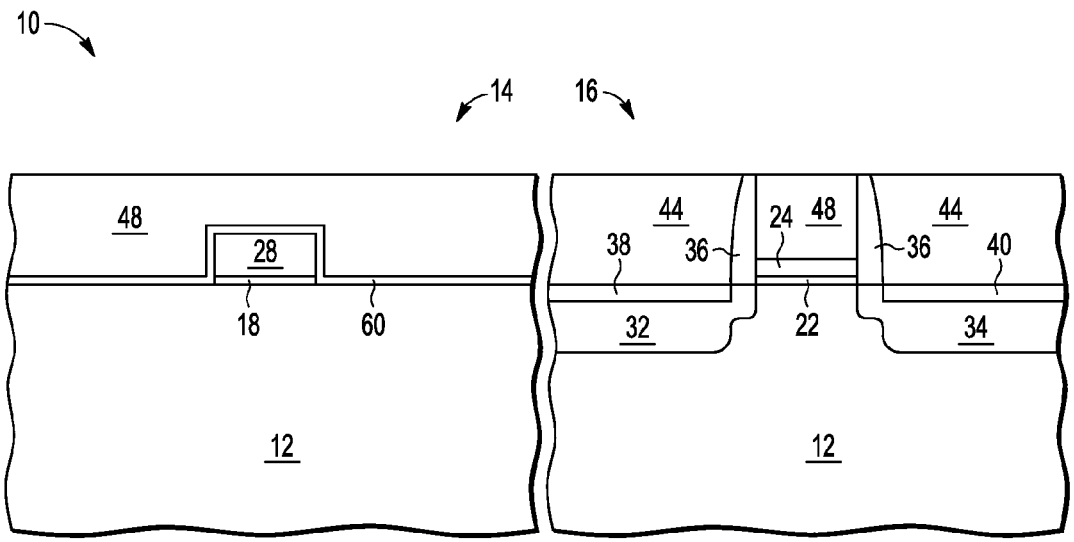
FIG. 13 is a cross section of a non-volatile memory cell and a replacement gate transistor at a stage in processing according to a second embodiment following the structure shown in FIG. 10.

Shown in FIG. 13 is semiconductor structure 100 after forming a layer of nitride or nanocrystals 60 with dielectric layers above and below the nitride or nanocrystals instead of dielectric layer 46 as shown being first formed in FIG. 11 for the case where layer 28 is polysilicon. In a such case, the structure of polysilicon from layer 28 shown in FIG. 13 is for forming a select gate in a split gate NVM cell. Logic region 16 is the same after the deposition of metal layer 48. Nitride or nanocrystal layer 60 is over the substrate and remaining structure of layer 28 and is removed from logic region 16 prior to the deposition of layer 48. Nitride or nanocrystal layer 60 may also include a barrier layer as the top layer similar to barrier layer 24.

Figure 14:
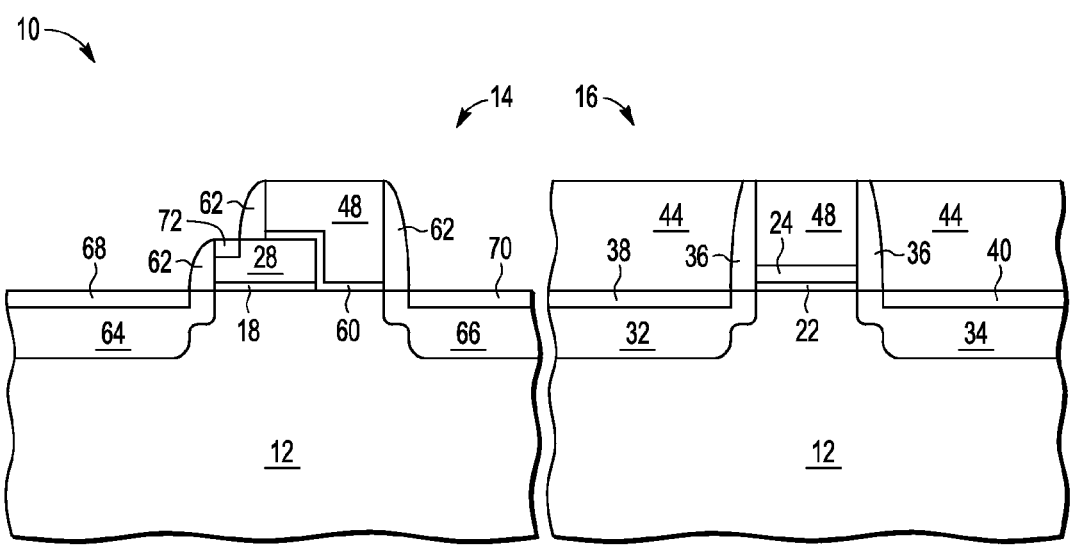
FIG. 14 is a cross section of a non-volatile memory cell and a replacement gate transistor of FIG. 13 at a subsequent stage in processing.

Shown in FIG. 14 is semiconductor structure 100 after performing the steps for forming a memory cell that is of the split gate type with sidewall spacers 62, source/drain regions 64 and 66 in substrate 12. The nitride or nanocrsystals are removed in areas not covered by the remaining structure of layer 48. Formed also are a silicide region 68 in the top portion of source/drain region 64, a silicide region 70 in the top portion of source/drain region 66, and a silicide region 72 on layer 28 that is adjacent to sidewall spacer 62.

Thus it is seen that an NVM cell can be formed in combination with a logic transistor in which a significant portion of the NVM cell is formed as a combination of two different depositions, with intervening steps, of the same material. In one case the significant portion is a charge storage region that can either be conductive in the case of polysilicon or non-conductive in the case of nitride. In the case of polysilicon, the significant portion can alternatively be the select gate of a split gate NVM cell. Thus it is possible to obtain a replacement gate logic transistor while still retaining the option of high quality high temperature oxide for the gate dielectric under either the charge storage layer or the select gate of a split gate memory cell.

In an alternate embodiment, the structure of layer 28 is not recessed, but is left as full thickness. In this case, following the deposition and patterning of dielectric layer 46 or nanocrystal layer 60, separate metal gate layer deposition and patterning steps are employed for the logic and NVM regions tracking those described previously.

Although the invention is described herein with reference to specific embodiments, various modifications and changes can be made without departing from the scope of the present invention as set forth in the claims below. For example, the particular dimensions may vary and material variations may be found feasible. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

By now it should be apparent that a method for forming a semiconductor structure having a non-volatile memory (NVM) region and a logic region has been disclosed. The method includes forming an oxide-containing layer directly on a semiconductor layer in the NVM region. The method further includes forming a first partial layer of a first material over the oxide-containing layer in the NVM region. The method further includes forming a first dielectric layer having a high dielectric constant directly on the semiconductor layer in the logic region. The method further includes forming a first conductive layer over the first dielectric layer in the logic region. The method further includes forming a second partial layer of the first material directly on the first partial layer in the NVM region and over the first conductive layer in the logic region. The method further includes forming a logic device in the logic region, wherein the logic device includes a portion of the first dielectric layer and the first conductive layer. The method further includes forming an NVM cell in the NVM region using the oxide-containing layer, the first partial layer, and the second partial layer, wherein the first partial layer and the second partial layer together are used to form one of a charge storage layer if the NVM cell is a floating gate NVM cell or a select gate if the NVM cell is a split gate NVM cell. The method may have a further characterization by which the step of forming the logic device in the logic region includes patterning the second partial layer, the first conductive layer, and the first dielectric layer to form a logic stack in the logic region and replacing the second partial layer with a second conductive layer in the logic stack. The method may have a further characterization by which the NVM cell is a floating gate NVM cell and the first material is nitride. The method may have a further characterization by which the first material is polysilicon. The method may have a further characterization by which the first conductive layer comprises a metal. The method may have a further characterization by which the first conductive layer operates to set a work function of the logic device in the logic region. The method may have a further characterization by which the steps of forming the oxide-containing layer and the first partial layer include growing the oxide-containing layer on the semiconductor layer in the NVM region and the logic region, depositing the first partial layer over the oxide-containing layer in the NVM region and the logic region, and removing the oxide-containing layer and the first partial layer from the logic region. The method may have a further characterization by which the steps of forming the first dielectric layer and the first conductive layer include depositing the first dielectric layer over the first partial layer in the NVM region and on the semiconductor layer in the logic region, depositing the first conductive layer over the first dielectric layer in the NVM region and the logic region, and using the first partial layer in the NVM region as an etch stop layer to remove the first conductive layer and the first dielectric layer from the NVM region. The method may have a further characterization by which. The method may have a further characterization by which, when the NVM cell is a floating gate NVM cell, the method further includes patterning the second partial layer, the first conductive layer, and the first dielectric layer to form a logic stack in the logic region, patterning the first partial layer and the second partial layer to form the charge storage layer of the floating gate NVM cell in the NVM region, forming a second dielectric layer over the charge storage layer in the NVM region, removing the second partial layer from the logic stack in the logic region, forming a second conductive layer over the second dielectric layer in the NVM region and over the first conductive layer of the logic stack in the logic region, and patterning the second conductive layer in the NVM region to form a control gate of the floating gate NVM cell. The method may have a further characterization by which, when the NVM cell is a split gate NVM cell, the method further includes patterning the second partial layer, the first conductive layer, and the first dielectric layer to form a logic stack in the logic region, patterning the first partial layer and the second partial layer to form the select gate of the split gate NVM cell in the NVM region, forming a second dielectric layer over the select gate in the NVM region, removing the second partial layer from the logic stack in the logic region, forming a second conductive layer over the second dielectric layer in the NVM region and over the first conductive layer of the logic stack in the logic region, and patterning the second conductive layer in the NVM region to form a control gate of the split gate NVM cell.

Disclosed also is a method for forming a semiconductor structure having a non-volatile memory (NVM) region and a logic region. The method includes forming an oxide-containing layer on a semiconductor layer in the NVM region and the logic region. The method further includes forming a first partial layer of a first material over the oxide-containing layer in the NVM region and the logic region. The method further includes removing the oxide-containing layer and the first partial layer from the logic region. The method further includes forming a first dielectric layer having a high dielectric constant over the first partial layer in the NVM region and over the semiconductor layer in the logic region. The method further includes forming a first conductive layer over the first dielectric layer in the NVM region and the logic region. The method further includes removing the first dielectric layer and the first conductive layer from the NVM region. The method further includes forming a second partial layer of the first material directly on the first partial layer in the NVM region and over the first conductive layer in the logic region. The method further includes. The method further includes forming a logic device in the logic region using the second partial layer as a dummy gate, wherein the logic device includes a portion of the first dielectric layer and the first conductive layer. The method further includes forming an NVM cell in the NVM region using the oxide-containing layer, the first partial layer, and the second partial layer, wherein the first partial layer and the second partial layer together are used to form one of a charge storage layer if the NVM cell is a floating gate NVM cell or a select gate if the NVM cell is a split gate NVM cell. The method may further include forming a second conductive layer in the NVM region and the logic region, wherein the second conductive layer is formed over the second partial layer in the NVM region and is used to replace the dummy gate of the logic device in the logic region. The method may have a further characterization by which the step of forming the oxide-containing layer on the semiconductor layer in the NVM region and the logic region includes growing the oxide-containing layer on the semiconductor layer in the NVM region and the logic region. The method may have a further characterization by which the NVM cell is a floating gate NVM cell and the first material is nitride. The method may have a further characterization by which the first material is polysilicon. The method may have a further characterization by which the first conductive layer comprises a metal. The method may have a further characterization by which the first conductive layer operates to set a work function of the logic device in the logic region.

Also disclosed is a method for forming a semiconductor structure having a non-volatile memory (NVM) region and a logic region. The method includes forming an oxide-containing layer directly on a semiconductor layer in the NVM region. The method further includes forming a first polysilicon layer over the oxide-containing layer in the NVM region. The method further includes forming a first dielectric layer having a high dielectric constant directly on the semiconductor layer in the logic region. The method further includes forming a first conductive layer over the first dielectric layer in the logic region. The method further includes forming a second polysilicon layer directly on the first polysilicon layer in the NVM region and over the first conductive layer in the logic region. The method further includes forming a logic device in the logic region, wherein the logic device includes a portion of the first dielectric layer and the first conductive layer. The method further includes forming an NVM cell in the NVM region using the oxide-containing layer, the first polysilicon layer, and the second polysilicon layer, wherein the first polysilicon layer and the second polysilicon layer together are used to form a common layer of the NVM cell. The method may have a further characterization by which the step of forming the logic device in the logic region includes patterning the second polysilicon layer, the first conductive layer, and the first dielectric layer to form a logic stack in the logic region, removing the second polysilicon layer from the logic stack, forming a second conductive layer over the common layer of the NVM cell in the NVM region and over the first conductive layer of the logic stack, and patterning the second conductive layer to form a control gate of the NVM cell over the common layer. The method may have a further characterization by which the common layer of the NVM cell is characterized as one of a select gate of the NVM cell or a charge storage layer of the NVM cell.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure having a non-volatile memory (NVM) region and a logic region, the method comprising:
   forming an oxide-containing layer directly on a semiconductor layer in the NVM region;
   forming a first partial layer of a first material directly on the oxide-containing layer in the NVM region;
   forming a first dielectric layer having a high dielectric constant directly on the semiconductor layer in the logic region;
   forming a first conductive layer directly on the first dielectric layer in the logic region;
   forming a second partial layer of the first material directly on the first partial layer in the NVM region and directly on the first conductive layer in the logic region;
   forming a logic device in the logic region, wherein the logic device includes a portion of the first dielectric layer and the first conductive layer; and
   forming an NVM cell in the NVM region using the oxide-containing layer, the first partial layer, and the second partial layer, wherein the first partial layer and the second partial layer together are used to form one of:
      a charge storage layer, wherein the NVM cell comprises a floating gate NVM cell, and
      a select gate, wherein the NVM cell comprises a split gate NVM cell.

2. The method of claim 1, wherein the step of forming the logic device in the logic region comprises:
   patterning the second partial layer, the first conductive layer, and the first dielectric layer to form a logic stack in the logic region; and
   replacing the second partial layer with a second conductive layer in the logic stack.

3. The method of claim 1, wherein the NVM cell is a floating gate NVM cell and the first material is nitride.

4. The method of claim 1, wherein the first material is polysilicon.

5. The method of claim 1, wherein the first conductive layer comprises a metal.

6. The method of claim 1, wherein the first conductive layer operates to set a work function of the logic device in the logic region.

7. The method of claim 1, wherein the steps of forming the oxide-containing layer and the first partial layer comprise:
   growing the oxide-containing layer on the semiconductor layer in the NVM region and the logic region;
   depositing the first partial layer over the oxide-containing layer in the NVM region and the logic region; and
   removing the oxide-containing layer and the first partial layer from the logic region.

8. The method of claim 1, wherein the steps of forming the first dielectric layer and the first conductive layer comprise:
   depositing the first dielectric layer over the first partial layer in the NVM region and on the semiconductor layer in the logic region;
   depositing the first conductive layer over the first dielectric layer in the NVM region and the logic region; and
   using the first partial layer in the NVM region as an etch stop layer to remove the first conductive layer and the first dielectric layer from the NVM region.

9. The method of claim 1, wherein the NVM cell comprises the floating gate NVM cell, the method further comprises:
   patterning the second partial layer, the first conductive layer, and the first dielectric layer to form a logic stack in the logic region;
   patterning the first partial layer and the second partial layer to form the charge storage layer of the floating gate NVM cell in the NVM region;
   forming a second dielectric layer over the charge storage layer in the NVM region;
   removing the second partial layer from the logic stack in the logic region;
   forming a second conductive layer over the second dielectric layer in the NVM region and over the first conductive layer of the logic stack in the logic region; and
   patterning the second conductive layer in the NVM region to form a control gate of the floating gate NVM cell.

10. The method of claim 1, wherein the NVM cell comprises the split gate NVM cell, the method further comprises:
   patterning the second partial layer, the first conductive layer, and the first dielectric layer to form a logic stack in the logic region;
   patterning the first partial layer and the second partial layer to form the select gate of the split gate NVM cell in the NVM region;
   forming a second dielectric layer over the select gate in the NVM region;
   removing the second partial layer from the logic stack in the logic region; and forming a second conductive layer over the second dielectric layer in the NVM region and over the first conductive layer of the logic stack in the logic region; and patterning the second conductive layer in the NVM region to form a control gate of the split gate NVM cell.

11. A method for forming a semiconductor structure having a non-volatile memory (NVM) region and a logic region, the method comprising:

forming an oxide-containing layer on a semiconductor layer in the NVM region and the logic region;

forming a first partial layer of a first material over the oxide-containing layer in the NVM region and the logic region;

removing the oxide-containing layer and the first partial layer from the logic region;

forming a first dielectric layer having a high dielectric constant over the first partial layer in the NVM region and over the semiconductor layer in the logic region;

forming a first conductive layer over the first dielectric layer in the NVM region and the logic region;

removing the first dielectric layer and the first conductive layer from the NVM region;

forming a second partial layer of the first material directly on the first partial layer in the NVM region and over the first conductive layer in the logic region;

forming a logic device in the logic region using the second partial layer as a dummy gate, wherein the logic device includes a portion of the first dielectric layer and the first conductive layer; and forming an NVM cell in the NVM region using the oxide-containing layer, the first partial layer, and the second partial layer, wherein the first partial layer and the second partial layer together are used to form one of:

a charge storage layer, wherein the NVM cell comprises a floating gate NVM cell, and a select gate, wherein the NVM cell comprises a split gate NVM cell.

12. The method of claim 11, further comprising:

forming a second conductive layer in the NVM region and the logic region, wherein the second conductive layer is formed over the second partial layer in the NVM region and is used to replace the dummy gate of the logic device in the logic region.

13. The method of claim 11, wherein the step of forming the oxide-containing layer on the semiconductor layer in the NVM region and the logic region comprises:

growing the oxide-containing layer on the semiconductor layer in the NVM region and the logic region.

14. The method of claim 11, wherein the NVM cell is a floating gate NVM cell and the first material is nitride.

15. The method of claim 11, wherein the first material is polysilicon.

16. The method of claim 11, wherein the first conductive layer comprises a metal.

17. The method of claim 11, wherein the first conductive layer operates to set a work function of the logic device in the logic region.

18. A method for forming a semiconductor structure having a non-volatile memory (NVM) region and a logic region, the method comprising:

forming an oxide-containing layer directly on a semiconductor layer in the NVM region;

forming a first polysilicon layer directly on the oxide-containing layer in the NVM region;

forming a first dielectric layer having a high dielectric constant directly on the semiconductor layer in the logic region;

forming a first conductive layer directly on the first dielectric layer in the logic region;

forming a second polysilicon layer directly on the first polysilicon layer in the NVM region and directly on the first conductive layer in the logic region;

forming a logic device in the logic region, wherein the logic device includes a portion of the first dielectric layer and the first conductive layer; and forming an NVM cell in the NVM region using the oxide-containing layer, the first polysilicon layer, and the second polysilicon layer, wherein the first polysilicon layer and the second polysilicon layer together are used to form a common layer of the NVM cell.

19. The method of claim 18, wherein the step of forming the logic device in the logic region comprises:

patterning the second polysilicon layer, the first conductive layer, and the first dielectric layer to form a logic stack in the logic region;

removing the second polysilicon layer from the logic stack;

forming a second conductive layer over the common layer of the NVM cell in the NVM region and over the first conductive layer of the logic stack; and patterning the second conductive layer to form a control gate of the NVM cell over the common layer.

20. The method of claim 19, wherein the common layer of the NVM cell is characterized as one of a select gate of the NVM cell or a charge storage layer of the NVM cell.

* * * * *